(12) United States Patent
Solf et al.

(10) Patent No.: US 8,604,567 B2
(45) Date of Patent: Dec. 10, 2013

(54) MICROMECHANICAL SYSTEM AND METHOD FOR MANUFACTURING A MICROMECHANICAL SYSTEM

(75) Inventors: Christian Solf, Karlsruhe (DE); Michael Knauss, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/023,801

(22) Filed: Feb. 9, 2011

(65) Prior Publication Data

US 2011/0193184 A1 Aug. 11, 2011

(30) Foreign Application Priority Data

Feb. 10, 2010 (DE) .......... 10 2010 001 759

(51) Int. Cl.
*G01P 15/08* (2006.01)
(52) U.S. Cl.
USPC .......................................... 257/417; 257/414

(58) Field of Classification Search
USPC .................................................. 257/417, 414
See application file for complete search history.

(56) References Cited

U.S. PATENT DOCUMENTS

| | | | |
|---|---|---|---|
| 7,701,631 B2 * | 4/2010 | Floyd et al. .................... | 359/290 |
| 7,781,852 B1 * | 8/2010 | Faheem et al. ................ | 257/419 |
| 2009/0001553 A1 * | 1/2009 | Pahl et al. ...................... | 257/704 |
| 2011/0210407 A1 * | 9/2011 | Katayama et al. ............ | 257/414 |

FOREIGN PATENT DOCUMENTS

DE 199 29 026 12/2000

* cited by examiner

*Primary Examiner* — Douglas Menz
(74) *Attorney, Agent, or Firm* — Kenyon & Kenyon LLP

(57) ABSTRACT

A micromechanical system having at least one micromechanical device, in particular a sensor device and/or an actuator device, the micromechanical system having a substrate on which at least one micromechanical device is provided, the micromechanical device having at least one structured or unstructured film adhesive on at least one side.

6 Claims, 2 Drawing Sheets

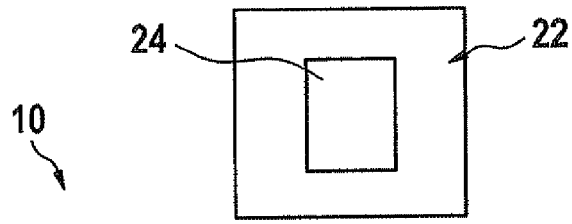
Fig. 1
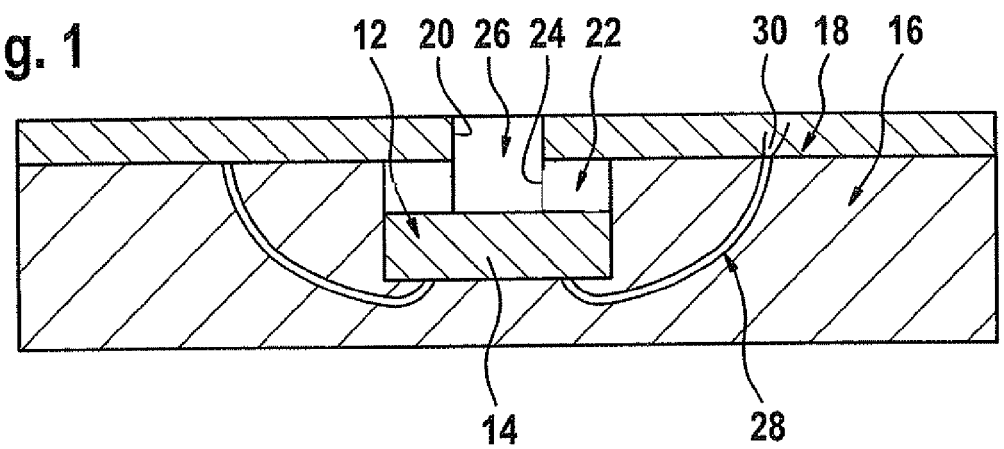
Fig. 2
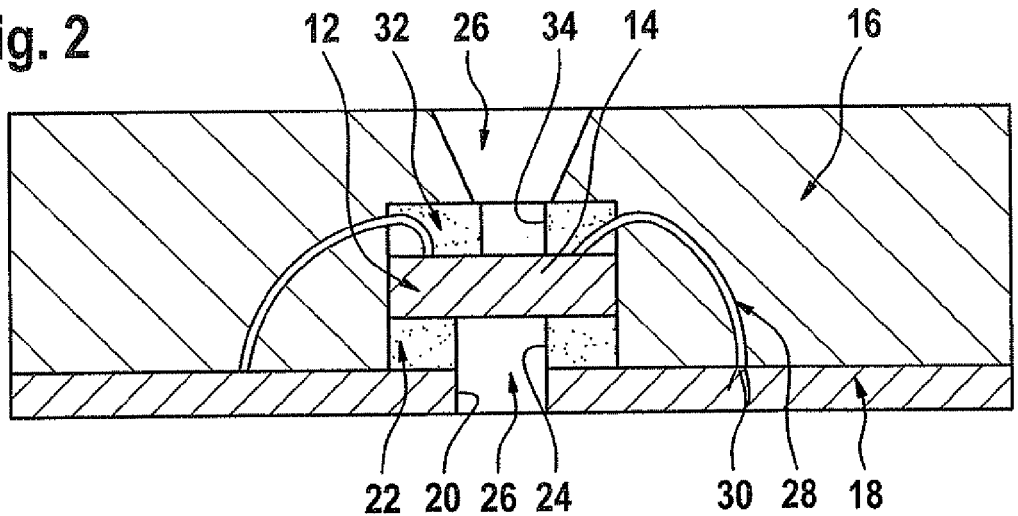

MICROMECHANICAL SYSTEM AND METHOD FOR MANUFACTURING A MICROMECHANICAL SYSTEM

RELATED APPLICATION INFORMATION

The present application claims priority to and the benefit of German patent application no. 10 2010 001 759.0, which was filed in Germany on Feb. 10, 2010, the disclosure of which is incorporated herein by reference.

FIELD OF THE INVENTION

The present invention relates to a micromechanical system having at least one micromechanical device, in particular a sensor device and/or an actuator device and a method for manufacturing a micromechanical system, in particular having at least one sensor device, for example, a pressure sensor device and/or an actuator device.

BACKGROUND INFORMATION

German patent document DE 199 29 026 A1 discusses a method for manufacturing a pressure sensor. In this method, a semiconductor pressure pickup is mounted on a mounting segment of a conductor grid so that the semiconductor pressure pickup is electrically connected to contact segments of the conductor grid. In addition, the conductor grid together with the semiconductor pressure pickup is inserted into an injection mold and then the semiconductor pressure pickup is surrounded by a housing made of an injection compound using the injection mold. A stamp is situated in the injection mold at a distance from the side of the mounting segment facing away from the semiconductor pressure pickup and separated therefrom by a gap, for example. A reduction in flowability of the injection compound in the area of the stamp is induced by a change in the temperature of the stamp in relation to the temperature of the liquefied injection compound, thereby preventing at least complete penetration of the injection compound into the gap.

SUMMARY OF THE INVENTION

According to the exemplary embodiments and/or exemplary methods of the present invention, an alternative micromechanical system, in particular a system having a sensor device such as a pressure sensor device and an alternative method for manufacturing a micromechanical system are made available.

More precisely, a micromechanical system having at least one micromechanical device is made available, in particular a sensor device and/or an actuator device, the micromechanical system having a substrate on which at least one micromechanical device is provided, the micromechanical device having at least one structured or unstructured film adhesive on at least one side.

The micromechanical system has the advantage that the structured film adhesive may be formed to have an opening to provide access to the micromechanical device through the housing, for example. The structured film adhesive of the micromechanical system has the advantage in particular that, in contrast with liquid or gelatinous adhesives, it does not run. In addition, the micromechanical system having the unstructured film adhesive has the advantage that it allows a defined connection to the micromechanical device, for example, a pressure sensor device and thus may be used, for example, for transmitting pressure to a diaphragm of the pressure sensor device. The micromechanical system having the unstructured film adhesive, like that having the structured film adhesive, has the advantage that it has a defined shape and thereby simplifies the manufacture of the micromechanical system and increases its precision in comparison with using liquid adhesives. The film adhesive may thus be used for equalizing stresses in the micromechanical system in particular.

Advantageous embodiments and refinements of the present invention are derived from the description herein as well as the description with reference to the drawings.

In one specific embodiment of the present invention, the substrate is provided with at least one opening, a film adhesive to which the micromechanical device is attached being provided over the opening. The film adhesive may be structured and may have an opening over the opening in the substrate or may be designed to be unstructured and to transmit a pressure onto a diaphragm of the micromechanical device, e.g., a pressure sensor device. The structured or unstructured film adhesive over the opening in the substrate has the advantage that defined access to the micromechanical device may be provided without allowing the opening in the substrate to become unintentionally clogged with the adhesive. In another specific embodiment, however, the substrate may not have any opening and a structured or unstructured film adhesive may be provided for fastening the micromechanical device on the substrate.

In another specific embodiment of the present invention, a film adhesive is provided on at least one other side of the micromechanical device, which may be the opposite side of the particular micromechanical device. The film adhesive that is provided on the micromechanical device may be structured or unstructured. In the case of a structured film adhesive, at least one opening may be provided as the structuring in the film adhesive. The additional film adhesive on the opposite side of the micromechanical device may be connected at its opening to a cavity or opening in the housing of the micromechanical system. Instead of this, an unstructured film adhesive may also be used as a type of diaphragm to transmit a pressure via an opening in the housing to the micromechanical device, for example, a pressure sensor.

In another specific embodiment according to the present invention, the micromechanical device is surrounded peripherally completely or at least partially by the film adhesive. This has the advantage that the micromechanical device may be protected from tensions or stress particularly well.

In another specific embodiment according to the present invention, the micromechanical system is provided with a mold housing, the mold housing having at least one opening or a cavity, which is connected to a film adhesive on the micromechanical device. The at least one opening or cavity in the mold housing may likewise be connected directly to the micromechanical device. In this case, for example, a film adhesive may be provided with an opening on the micromechanical device, this film adhesive being connected to the opening or cavity in the mold housing. These exemplary embodiments are suitable in particular for pressure sensor devices for determining pressure.

In one specific embodiment of the present invention, the micromechanical device is, for example, a sensor device, in particular a pressure sensor device, a yaw rate sensor device or an acceleration sensor device and/or an actuator device, or a microactuator device, for example, a micromirror device. However, the exemplary embodiments and/or exemplary methods of the present invention are not limited to these examples.

The exemplary embodiments and/or exemplary methods of the present invention are explained in greater detail below on the basis of the exemplary embodiments, which are illustrated in the schematic figures in the drawings.

BRIEF DESCRIPTION OF THE DRAWINGS

FIG. 1 shows a sectional view through a mold housing having a sensor device, here a pressure sensor device, according to a first specific embodiment of the present invention.

FIG. 2 shows a sectional view through a mold housing having a sensor device according to a second specific embodiment of the present invention.

DETAILED DESCRIPTION

Figure 3:
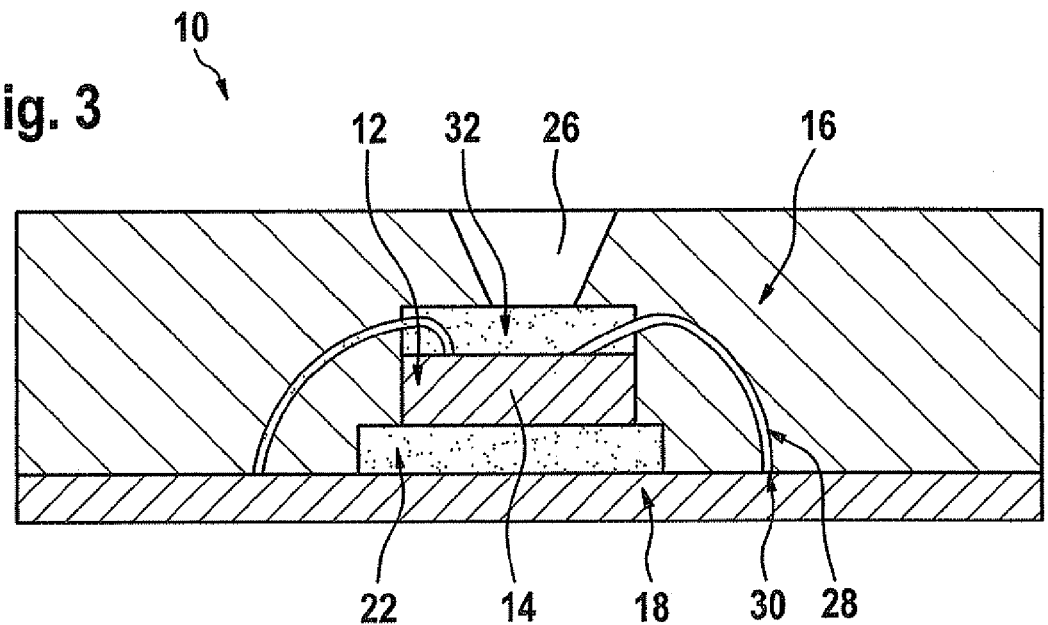
FIG. 3 shows a sectional view through a mold housing having a sensor device according to a third specific embodiment of the present invention.

In all the figures, elements and devices which are the same or have the same function are labeled with the same reference numerals, unless otherwise indicated. In addition, the representation of the mold housing and of the sensor device in the following figures is purely schematic and greatly simplified and is not drawn to scale.

FIG. 1 shows a sectional view through a micromechanical system 10 according to a first specific embodiment of the present invention. Micromechanical system 10 has a sensor device 14, for example, a pressure sensor device, as at least one micromechanical device 12.

Pressure sensor device 14 in addition has a diaphragm, for example, for determining pressure; in the example shown in FIG. 1, the chip or sensor device 14 and its diaphragm are placed on a conductor grid or substrate 18 on the lower side of the mold housing 16 opposite the bond pads.

In this specific embodiment, a substrate 18 or a conductor grid or a so-called lead frame is provided, substrate 18 or the conductor grid in the present example having at least one opening 20 or a hollow space or a cavity in a mounting segment for sensor device 14. A planar segment of conductor grid 18 or a so-called die pad functions as the mounting segment. According to the present invention, a first film adhesive 22 is then applied to conductor grid 18 or its mounting segment. Film adhesive 22 is structured, for example, and is provided with an opening 24, so that access 26 to pressure sensor device 14, namely in the present example to the diaphragm of pressure sensor device 14 for determining pressure, may be provided via opening 20 in the conductor grid or substrate 18 and opening 24 in film adhesive 22. Film adhesive 22 may be structured in advance, i.e., may be designed here to have opening 24, for example, and may then be applied with its opening 24 over opening 20 of the conductor grid or substrate 18. Film adhesive 22 may also be initially without an opening, i.e., unstructured, when applied over opening 20 of the conductor grid or substrate 18 and then structured, i.e., opening 24 is produced in film adhesive 22, for example, using a laser or some other device suitable for structuring the film adhesive and forming an opening in the film adhesive.

Next, at least one micromechanical device 12, e.g., a sensor device 14, is provided on first film adhesive 22, for example, a pressure sensor device 14 as described above being provided. In addition, sensor device 14 is electrically connected to one or more contact segments or bond pads 30 of conductor grid 18 via one or more conductor wires or bond wires 28, for example. Connected to this, sensor device 14 and its bond wires 28 may be sheathed by an injection compound or molding compound to form mold housing 16. For example, an injection compound, e.g., a thermoset plastic, epoxy and/or thermoplastic may initially be liquefied, for example, and then sensor device 14 may be sheathed therewith. This method is known as transfer molding. However, the present invention is not limited to this specific method or to the aforementioned examples for injection molding to produce mold housing 16. Any other method and any other material or combination of materials may also be used if they are suitable for providing a mold housing 16 for a micromechanical device 12, e.g., a sensor device 14.

Micromechanical system 10 according to the present invention, having micromechanical device 12 such as sensor device 14 here, and the method according to the present invention for manufacturing micromechanical system 10 have the advantage that they allow decoupling of stresses. Furthermore, in the case of pressure sensor devices 14 as the sensor devices, the necessary cavities or hollow spaces, i.e., accesses 26, may be formed in particular mold housing 16 in a very simple and reliable manner. Film adhesive 22, used according to the present invention, has the advantage that it resembles a double-sided adhesive tape and may be applied in a solid form. This allows film adhesives 22 to be structured before and/or after application. In addition, film adhesive 22 may be applied in a defined form or contour in contrast with liquid adhesives, which run and therefore require additional measures, e.g., a stamp, to form cavities for pressure sensor device 14.

FIG. 2 shows a sectional view through a micromechanical system 10 according to a second specific embodiment of the present invention. Micromechanical system 10, for example, also has a sensor device 14, such as a pressure sensor device 14 as micromechanical device 12. In this exemplary embodiment, mold housing 16 of micromechanical system 10 has two accesses 26 for micromechanical device 12, for example, pressure sensor device 14 here. Depending on micromechanical device 12, however, a mold housing 16 may also be formed, having no access to the outside as shown in FIGS. 1 and 2 as an example, but instead being designed to be closed. This is true of all the specific embodiments of the present invention. Micromechanical device 12 in which a closed mold housing is formed may be, for example, a yaw rate sensor device or an acceleration sensor device, to mention just two examples.

As shown in FIG. 2, a substrate 18 or a conductor grid or a so-called lead frame is initially provided. Substrate 18 or the conductor grid here has, for example, at least one opening 20 or a hollow space or a cavity in a mounting segment for sensor device 14. As described previously, a planar segment of conductor grid 18 or a so-called die pad functions as the mounting segment. For subsequent attachment of sensor device 14, a first film adhesive 22 is applied to the mounting segment. Film adhesive 22 is structured in advance, for example, and provided with an opening 24, so that access through opening 20 in conductor grid 18 and opening 24 in film adhesive 22 to pressure sensor device 14 may be provided, namely in the present example to the diaphragm of pressure sensor device 14 for determining pressure. Instead of forming opening 24 in film adhesive 22 in advance and then applying film adhesive 22 with its opening 24 over opening 20 of conductor grid 18, film adhesive 22 may also initially be unstructured, i.e., without an opening here, when applied over opening 20 of conductor grid 18. Opening 24 may then be created in film adhesive 22 or the latter may be structured as already described previously, for example, using a laser or some other device suitable for structuring the film adhesive and creating an opening in the film adhesive.

Finally, sensor device 14, here pressure sensor device 14, is applied to film adhesive 22 with its opening 24. Sensor device 14 is electrically connected to one or more contact segments or bond pads 30 of conductor grid 18, for example, via one or more conductor wires or bond wires 28. To provide a second access 26 to sensor device 14, for example, on the opposite side of sensor 14 as shown in FIG. 2, a second film adhesive 32 is also applied to this side. Film adhesive 32 is applied over bond wires 38, which are thereby additionally protected from media. Film adhesive 32 may first be provided with an opening 34 or first applied to sensor device 14 without an opening and then structured or provided with an opening 34 here. As described previously, the structuring may be performed using a laser or some other suitable device. In other words, film adhesive 32 may be opened subsequently through the diaphragm of pressure sensor device 14 using the laser in the present example.

Following this, sensor device 14 and its bond wires 28 may be sheathed by an injection compound or molding compound to form mold housing 16. An additional stamp element (not shown) may be used, this stamp element being situated above opening 34 in film adhesive 32 to keep second access 26 free in mold housing 16 when sensor device 14, bond wires 28 and both film adhesives 22, 32 are sheathed, for example, to form mold housing 16. In other words, the stamp element shapes the cavity, i.e., the hollow space in the molding compound via the diaphragm of pressure sensor device 14. As described previously, the injection compound, for example, a thermoset plastic, epoxy and/or thermoplastic, may first be liquefied, then used to sheath the sensor device. The adhesive film at the same time assumes the function of compensating for tolerances between the mold and the sensor device. This method is known as transfer molding, but any other method and any other material or combination of materials may also be used if suitable for providing a mold housing 16 for a micromechanical device 12. Following the formation of mold housing 16, the stamp element is removed, so that access 26 remains in mold housing 16 via opening 34 in second film adhesive 32, as shown in FIG. 2. Housing 16 shown in FIG. 2 has the advantage that it has a pressure access 26 from two sides, for example, and is thus suitable for pressure sensor devices 14 for measuring pressure differences in particular.

Furthermore, FIG. 3 shows a sectional view through a micromechanical system 10 according to a third specific embodiment of the present invention. The micromechanical system 10 has, for example, a sensor device 18 [sic; 14] such as a pressure sensor device 14 as micromechanical device 12.

FIG. 3 shows another specific embodiment of housing 16 according to FIG. 2. The two specific embodiments according to FIGS. 2 and 3 differ essentially in that, in contrast with the specific embodiment according to FIG. 2, both film adhesives 22, 32 are unstructured in the specific embodiment in FIG. 3, i.e., film adhesives 22, 32 are not each provided with an opening. In addition, film adhesive 32 on sensor device 14, hereinafter described as second film adhesive 32, which is connected to an access 26 in mold housing 16, may be of such dimensions that it is able to absorb pressure and transfer it to a diaphragm of pressure sensor device 14 of micromechanical system 10, for example.

Otherwise in the specific embodiment as shown in FIG. 3, for example, a substrate 18 or a conductor grid or a lead frame is provided, but substrate 18 or the lead frame does not have an opening in a mounting segment or die pad for sensor device 14 in the present example. A first film adhesive 22 is applied first to the mounting segment for attaching sensor device 14, so that film adhesive 22 is not provided with an opening or is provided with such an opening later, for example, using a laser. Sensor device 14, here a pressure sensor device 14, for example, is applied to film adhesive 22. Bond wires 28 or the conductor wires of sensor device 14 are electrically connected to corresponding bond pads 30 or contact segments of conductor grid 18. In addition, a second film adhesive 32, for example, on the other side, here the top side of pressure sensor device 14, is applied, so that bond wires 28 are embedded in film adhesive 32. Second film adhesive 32 is also unstructured, i.e., it does not have an opening and no opening is formed later in film adhesive 32, for example, using a laser. A stamp element (not shown), which forms the cavity, i.e., the hollow space, in the mold compound over sensor device 14 or, here, over the diaphragm of pressure sensor device 14, is used instead of a laser in the example shown in FIG. 3. As already described previously, sensor device 14 is sheathed, for example, to form a mold housing 16. The stamp element is then removed.

The specific embodiment according to FIG. 3 has the advantage that an access 26 for the pressure in the case of a pressure sensor device 14 as sensor device 14 may be provided, the pressure then being transferable via unstructured film adhesive 32 to a diaphragm of a pressure sensor device 14, for example. Due to the fact that particular film adhesive 22, 32 is not structured or provided with an opening, production may additionally be simplified and production costs further reduced.

Figure 4:
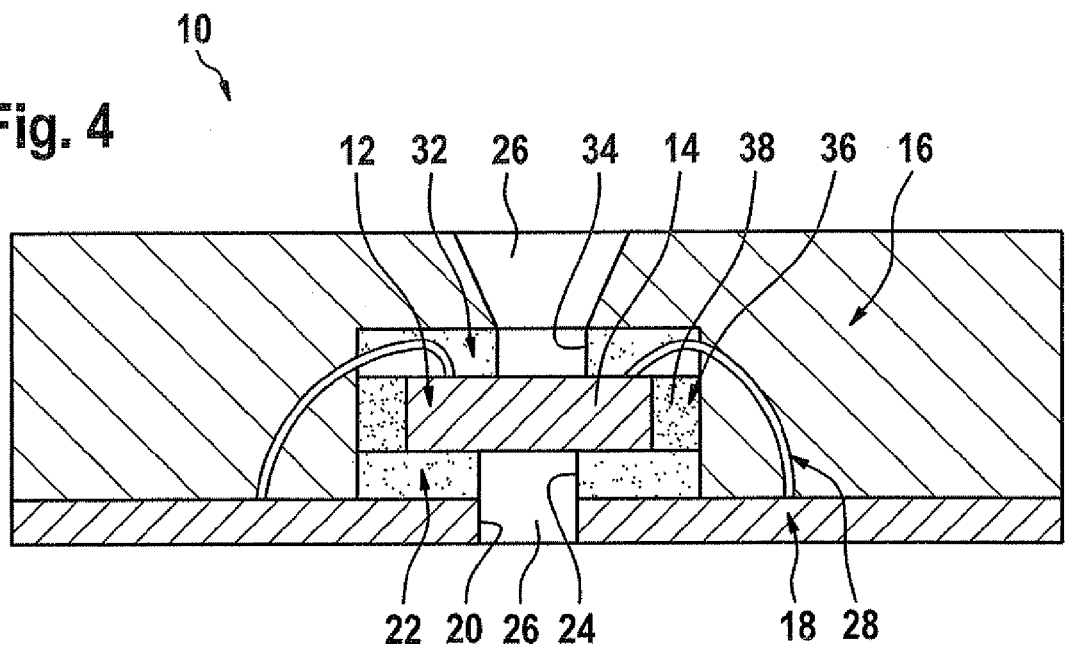
FIG. 4 shows a sectional view through a mold housing having a sensor device according to a fourth specific embodiment of the present invention.

FIG. 4 also shows a sectional view through a micromechanical system 10 according to a fourth specific embodiment of the present invention. Micromechanical system 10 also has a sensor device 14 such as a pressure sensor device 14, for example, as micromechanical device 12.

The specific embodiment of the present invention shown in FIG. 4 corresponds essentially to the specific embodiment according to the present invention as shown in FIG. 2, but sensor device 14 is surrounded peripherally by first, second and/or another (here third) film adhesive 36. In other words, FIG. 4 shows an example of a mold housing 16, in particular for pressure sensor devices 14 having a structured film adhesive 22, 32, 36 for complete stress decoupling of sensor device 14.

As FIG. 4 shows, the specific embodiment has a substrate 18 or a conductor grid or a lead frame. Substrate 18 or the conductor grid is provided with at least one opening 20 in a mounting segment or die pad for sensor device 14 in the example shown here. A first film adhesive 22 is then applied to the mounting segment for attaching sensor device 14, film adhesive 22 being provided with an opening 24. In addition, bond wires 28 or conductor wires of sensor device 14 are electrically connected to corresponding bond pads 30 or contact segments of conductor grid or substrate 18.

As described previously, film adhesive 22 may be designed to be structured with an opening 24 in advance and then applied to the mounting segment. However, film adhesive 22 may also be initially unstructured when applied to the mounting segment and next provided with an opening 24, for example, using a laser, which may be above opening 20 in the conductor grid or substrate 18. After film adhesive 22 with its opening 24 has been placed over opening 20 of the mounting segment of conductor grid 18, sensor device 14 is attached to film adhesive 22, for example, a pressure sensor device 14 which has a diaphragm for determining pressure, for example. In the example shown in FIG. 4, an additional film adhesive 36, namely the third here, for example, is applied peripherally or partially peripherally around sensor device 14. This film adhesive 36 may be configured to be structured and in doing so is provided with an opening 38 which corresponds to the contour of sensor device 14. This has the advantage that film adhesive 36 may be applied peripherally around sensor device 14 particularly easily. However, it is also possible in principle to apply an unstructured film adhesive and then to open it or provide it with an opening using a laser, for example, to enclose micromechanical device 12 or sensor device 14.

In the example shown in FIG. 4, film adhesive 22 protrudes laterally on the lower side of sensor device 14, film adhesive 36, the third film adhesive here, being applied to the protruding area of first film adhesive 22 to enclose sensor device 14. However, film adhesive 22 on the lower side may likewise be closed by sensor device 14, as shown in the exemplary embodiment in FIG. 2, for example. In this case, a thicker film adhesive accordingly will then also be used to enclose the sensor device, the adhesive at the same time being in contact with the surface of the conductor grid. Instead of providing a film adhesive which completely encloses sensor device 14, for example, and is provided with an opening corresponding to the contour of sensor device 14 as a film adhesive, for example, it is also possible to use two or more film adhesive segments that are combined or aligned in rows completely or at least partially surrounding the micromechanical device, for example, the sensor device here. Film adhesives 22, 32, 36 may be made of the same material or the same combination of materials or a different material or combination of materials. This is true of all the specific embodiments of the present invention.

Finally, another film adhesive 32, the second film adhesive here, is then provided on the top side of sensor device 14. It is provided with an opening 34 in the example shown in FIG. 4 to provide an access 26 to sensor device 14, for example, a pressure sensor device 14. Film adhesive 32 may be provided with opening 34 in advance or may be applied to sensor device 14 initially in an unstructured form and then provided with a corresponding opening 34 using a laser, for example. However, as in the example shown in FIG. 3, it is likewise possible to apply film adhesive 32 in an unstructured form, i.e., without an opening here, to sensor device 14, and instead a cavity may be formed exclusively in the mold compound or mold housing 16.

As shown in FIG. 4, bond wires 28 are embedded at least in film adhesive 32 on the top side of sensor device 14. In addition, in the example shown in FIG. 4, a stamp element (not shown) which shapes the cavity, i.e., hollow space in the molding compound over sensor device 14, i.e., here the diaphragm of pressure sensor device 14, is provided over opening 34 in film adhesive 32 on the top side of sensor device 14. As described previously, sensor device 14 is sheathed to form a mold housing 16, for example. The stamp element is removed later and access 26 in mold housing 16 is exposed, as shown in FIG. 4.

The difference between the specific embodiment according to FIG. 2 and the specific embodiment shown in FIG. 4 is that micromechanical device 12, for example, a pressure sensor device here, is surrounded peripherally by a structured film adhesive 36. Micromechanical device 12 is thus surrounded completely by film adhesive 22, 32, 36, which has the advantage that any mechanical stresses from the so-called thermal misfit between the mold components (so-called mold compounds or injection molding components) and the micromechanical device are absorbable, and thus sensitive micromechanical device 12 is additionally protected from mechanical stress. In other words, additional stress decoupling of sensitive pressure sensor devices 14, for example, may be achieved by enclosing such a sensor device 14 essentially entirely in film adhesive 22, 32, 36.

A so-called DAF film adhesive (die attach film) or a so-called DDAF film adhesive (dicing die attach film) may be used as film adhesive 22, 32, 36, to name but two examples, as used according to the present invention and as explained above on the basis of the exemplary embodiments according to the present invention as shown in FIGS. 1 through 4. However, the present invention is not limited to these two examples.

Although the present invention was described above on the basis of exemplary embodiments, it is not to be limited to them but instead may be modified in a variety of ways. In particular the exemplary embodiments described above may be combined with one another, in particular individual features thereof.

Thus in the specific embodiments shown in FIGS. 1, 2 and 3, for example, the sensor device may be surrounded completely laterally or at least partially by at least one film adhesive, as described in detail above with reference to FIG. 4. The film adhesive on the lower side of the sensor device and/or the film adhesive on the upper side of the sensor device may also be provided without structuring, e.g., without an opening, in the specific embodiments as shown in FIGS. 1, 2 and 4, for example, so that in this case a pressure may then be transferred to a pressure sensor device or its diaphragm via the unstructured film adhesive, as described in detail above with reference to FIG. 3.

Instead of a pressure sensor device as the sensor device, any other type of micromechanical device may also be provided, at least one film adhesive being used to attach the micromechanical device to a substrate or a conductor grid, for example. Depending on the sensor device or micromechanical device, at least one opening or cavity, i.e., hollow space, may be provided in the mold housing or no opening or cavity, i.e., hollow space, may be provided.

In addition, a film adhesive may be structured in any desired manner. For example, the film adhesive may be designed to have at least one opening and/or one recess, depending on the function and intended purpose.

What is claimed is:

1. A micromechanical system, comprising:
at least one micromechanical device, including at least one of a sensor device and an actuator device;
a substrate, on which at least one micromechanical device is applied, the micromechanical device having at least one structured or unstructured film adhesive on at least one side;
wherein the substrate has at least one opening, the film adhesive being provided over the opening, and wherein the film adhesive has an opening over the opening in the substrate, and wherein a size of the opening in the film adhesive is approximately equal to a size of the opening in the substrate;
wherein a film adhesive is provided on at least one other side of the micromechanical device, the film adhesive on the at least one other side being provided in structured or unstructured form on the micromechanical device, the at least one other side being non-coplanar with the at least one side.

2. The micromechanical system of claim 1, wherein the micromechanical device is surrounded peripherally completely or at least partially by a film adhesive.

3. The micromechanical system of claim 1, wherein the micromechanical system is provided with a mold housing, the mold housing having at least one access, which is directly connected to a film adhesive on the micromechanical device or is directly connected to the micromechanical device.

4. The micromechanical system of claim 1, wherein the micromechanical device is at least one of a sensor device, a yaw rate sensor device or an acceleration sensor device and an actuator device or a microactuator device.

5. The micromechanical system of claim 1, wherein a film adhesive is provided on at least one other side of the micromechanical device, on the opposite side of the micromechanical device, the film adhesive being provided in structured or unstructured form on the micromechanical device.

6. The micromechanical system of claim 1, wherein the micromechanical device is a sensor device, which is a pressure sensor device, a yaw rate sensor device or an acceleration sensor device and/or an actuator device or a microactuator device, which is a micromirror device.

* * * * *